United States Patent
Chiba et al.

(10) Patent No.: US 7,174,620 B2
(45) Date of Patent: Feb. 13, 2007

(54) METHOD OF MANUFACTURING THIN QUARTZ CRYSTAL WAFER

(75) Inventors: Akio Chiba, Saitama (JP); Kozo Ono, Saitama (JP); Tamotsu Kurosawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 40 days.

(21) Appl. No.: 10/746,400

(22) Filed: Dec. 26, 2003

(65) Prior Publication Data

US 2004/0135467 A1    Jul. 15, 2004

(30) Foreign Application Priority Data

Dec. 27, 2002  (JP) .............. 2002-380957

(51) Int. Cl.
*H04R 31/00*    (2006.01)
(52) U.S. Cl. .................. 29/594; 29/25.35; 29/417; 29/592.1; 216/65; 381/396; 381/398; 451/5; 451/41
(58) Field of Classification Search ........... 29/25.35, 29/417, 592.1, 594; 216/65; 381/396, 398; 451/4, 51

See application file for complete search history.

(56) References Cited

U.S. PATENT DOCUMENTS

| | | | |
|---|---|---|---|
| 4,094,752 A * | 6/1978 | Vahe ................ | 438/40 |
| 6,011,810 A * | 1/2000 | Haller et al. ........ | 372/45.01 |
| 6,257,224 B1 * | 7/2001 | Yoshino et al. ..... | 125/13.01 |
| 6,558,465 B1 * | 5/2003 | Katoh ............... | 117/1 |

FOREIGN PATENT DOCUMENTS

| | | | |
|---|---|---|---|
| JP | 51022676 A | * | 2/1976 |
| JP | 59054309 A | * | 3/1984 |
| JP | 2002-205181 | | 7/2002 |

OTHER PUBLICATIONS

"Study on microscopic defects in Fe-doped InP single crystals"; Kohiro, K.; Hirano, R.; Oda, O.; □□Indium Phosphide and Related Materials, 1995 Conference Proceedings., Seventh International Conference on May 9-13 1995 pp. 93-96.*

Takaoka Hidetsugu, "Principles and features of stealth dicing technique optimum for dicing ultrathin semiconductor wafers", Electronic materials (Denshi Zairyou in Japanese) (ISSN 0387-0774), vol. 41, No. 9, pp. 17-21, Sep. 2002.

* cited by examiner

*Primary Examiner*—Paul D Kim
(74) *Attorney, Agent, or Firm*—Muirhead & Saturnelli, LLC

(57) ABSTRACT

A method of manufacturing a thin quartz crystal wafer from a quartz crystal block which is cut from a crystal body of synthetic quartz crystal and has a flat principal surface, comprises the steps of (a) converging a laser beam at a region in said quartz crystal block at a predetermined depth from the principal surface thereof to cause multiphoton phenomenon state, thereby breaking Si—O—Si bonds of quartz crystal in said region to form voids in said region, and (b) peeling said thin quartz crystal wafer from a body of said quartz crystal block along said voids. The above process is repeatedly performed on one quartz crystal block to peel off a plurality of thin quartz crystal wafers successively from the principal surface of the quartz crystal block. Each of the thin quartz crystal wafers is divided into individual quartz crystal blanks for making quartz crystal units.

9 Claims, 3 Drawing Sheets

METHOD OF MANUFACTURING THIN QUARTZ CRYSTAL WAFER

BACKGROUND OF THE INVENTION

1. Field of the Invention

The present invention relates to a method of manufacturing a thin quartz crystal wafer from a crystal body of synthetic quartz crystal, and more particularly to a method of manufacturing a thin quartz crystal wafer using a laser beam.

2. Description of the Related Art

Synthetic quartz crystal that is produced by growing quartz crystal according to hydrothermal synthesis or the like is known as a major material of electronic components typified by quartz crystal units. A quartz crystal unit comprising a quartz crystal blank cut from synthetic quartz crystal and hermetically sealed in a casing is used as a frequency control element in an oscillator or a filter. An AT-cut quartz crystal blank whose resonant frequency is inversely proportional to its thickness is widely used in such a crystal unit. A crystal blank is generally manufactured by cutting a thin quartz crystal wafer having a desired thickness. In recent years, as the communication frequency is as high as 100 MHz or higher, for example, a crystal blank used as a quartz unit has a thickness of about 18 μm or less. Efforts have been made to develop a process of manufacturing such a crystal blank.

FIGS. 1A to 1C show successive steps of a conventional process of manufacturing a thin quartz crystal wafer. Thin quartz crystal wafer 1 is cut from quartz crystal block 2 in the form of a rectangular parallelepiped having flat surfaces. As shown in FIGS. 1A to 1C, if an AT-cut crystal blank is to be finally cut out, then quartz crystal block 2 is cut from a crystal block of synthetic quartz crystal along predetermined orientations (X-, Y'-, and Z'-axes) of quartz crystal. The X-, Y'-, and Z'-axes refer to crystalline axes that are crystallographically determined for quartz crystal. Quartz crystal block 2 is cut by a wire saw or a blade saw along line A—A in FIG. 1A to produce relatively thick quartz crystal wafer 3 having a thickness along the Y'-axis. The thickness of thick quartz crystal wafer 3 is of about 350 μm. Thereafter, thick quartz crystal wafer 3 is polished or ground into thin quartz crystal wafer 1 having a prescribed thickness. If a crystal blank for use in a 100 MHz crystal unit is to be produced from thin quartz crystal wafer 1, thin quartz crystal wafer 1 has a thickness of about 18 μm. Then, thin quartz crystal wafer 1 is cut into individual crystal blanks along line B—B and line C—C in FIG. 1C by photolithographic etching.

Finally, as shown in FIG. 2, exciting electrodes 5 and extension electrodes 6 are formed on respective principal surfaces of crystal blank 4, extension electrodes 6 extending from respective exciting electrodes 5 to an end of crystal blank 4 and having portions folded back onto the other principal surfaces across the end of crystal blank 4. Crystal blank 4 with exciting electrodes 5 and extension electrodes 6 mounted thereon is hermetically sealed in a casing, and predetermined electric connections are made to extension electrodes 6, thus completing a crystal unit.

According to the above manufacturing process, however, thin quartz crystal wafer 1 is obtained from a thick quartz crystal wafer having a thickness of several hundreds μm by polishing or grinding in the unit of μm. Therefore, the manufacturing process produces material wastes and is low in productivity. Since a wafer cut by the machining process using a wire saw or a blade saw has a thickness ranging from 200 to 400 μm as a lower limit, it is necessary to polish or grind thick quartz crystal wafer 3 in order to produce thin quartz crystal wafer 1 therefrom.

A technique known as "stealth dicing" has been proposed for producing a thin silicon semiconductor wafer having a thickness of about 30 μm without polishing or grinding. This technique employs a laser beam having a wavelength that is transmissive with respect to a semiconductor wafer to be processed thereby. The laser beam is converged inside the semiconductor wafer to cause multiphoton absorption in the converged area, thereby forming an internally modified region from which the semiconductor wafer starts to be divided. Details of stealth dicing are disclosed in Takaoka Hidetsugu, "Principles and features of stealth dicing technique optimum for dicing ultrathin semiconductor wafers", Electronic materials (Denshi Zairyou in Japanese) (ISSN 0387-0774), Vol. 41, No. 9, pp. 17–21, September 2002, and Japanese laid-open patent publication No. 2002-205181 (JP, P2002-205181A).

SUMMARY OF THE INVENTION

It is an object of the present invention to provide a method of manufacturing a thin quartz crystal wafer with increased productivity, with reduced quartz crystal wastes which is caused by polishing and grinding.

Another object of the present invention is to provide a method of manufacturing a crystal unit inexpensively using a method of manufacturing a thin quartz crystal wafer with increased productivity.

The objects of the present invention can be achieved by a method of manufacturing a thin quartz crystal wafer from a quartz crystal block which is cut from a crystal body of synthetic quartz crystal and has a flat principal surface, the method comprising the steps of (a) converging a laser beam at a region in the quartz crystal block at a predetermined depth from the principal surface thereof to cause multiphoton phenomenon state, thereby breaking Si—O—Si bonds of quartz crystal in the region to form voids in the region, and (b) peeling the thin quartz crystal wafer from a body of the quartz crystal block along the voids.

According to the present invention, the stealth dicing technique is applied to a quartz crystal block for manufacturing thin quartz crystal wafers with high productivity. The steps (a) and (b) may be repeatedly carried out on the quartz crystal block from which the thin quartz crystal wafer has been peeled, for thereby peeling a plurality of thin quartz crystal wafers successively from the principal surface of the quartz crystal block. According to this process, quartz crystal wastes may be reduced, and the productivity may further be increased. The principal surface of the quartz crystal block may be polished after the thin quartz crystal wafer has been peeled therefrom, and the step (a) may be carried out on the quartz crystal block. The laser beam may thus be well transmitted into the quartz crystal block, allowing the process of peeling off thin quartz crystal wafers successively from the quartz crystal block to be carried out better.

Each of the thin quartz crystal wafers thus obtained may be divided into individual crystal blanks for use in crystal units. Using such crystal blanks, crystal units can be produced inexpensively.

DETAILED DESCRIPTION OF THE INVENTION

A method of manufacturing a thin quartz crystal wafer according to a preferred embodiment of the present invention will be described below.

Figure 1A:
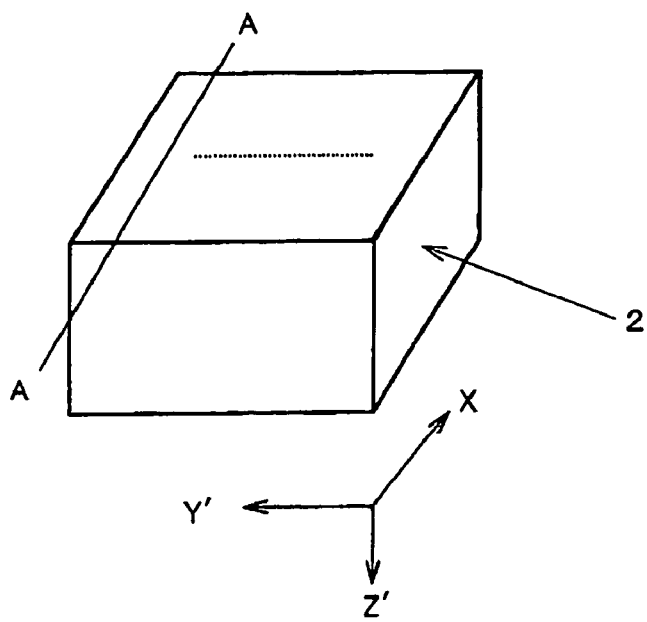
FIGS. 1A, 1B, and 1C are perspective views illustrative of a conventional process of manufacturing a thin quartz crystal wafer.
Figure 1B:
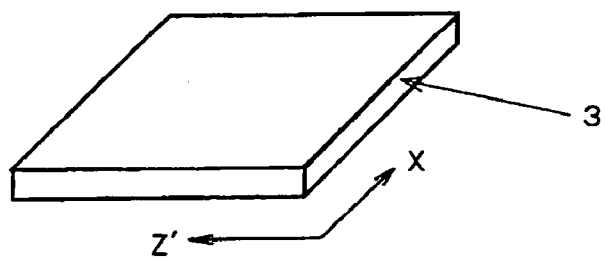
Figure 1C:
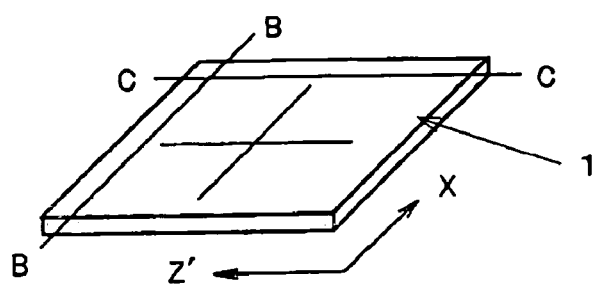
Figure 2:
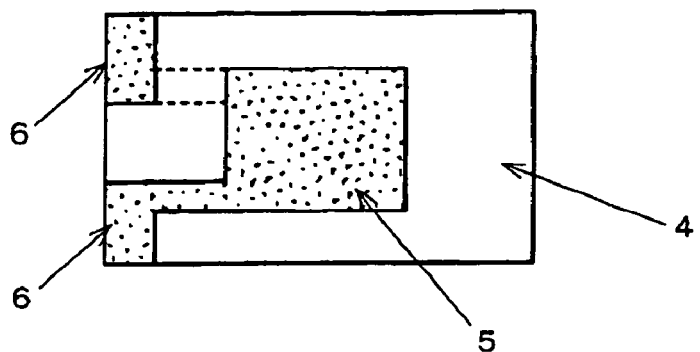
FIG. 2 is a plan view of a conventional crystal blank.
Figure 3A:
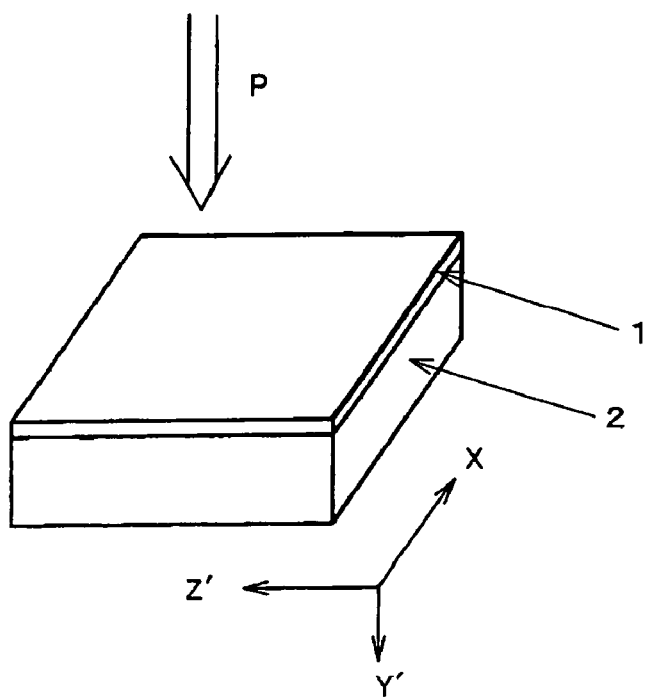
FIG. 3A is a perspective view illustrative of a method of manufacturing a thin quartz crystal wafer according to the present invention.

According to the embodiment, as shown in FIG. 3A, thin quartz crystal wafer 1 is cut from quartz crystal block 2 in the form of a rectangular parallelepiped having flat surfaces. AT-cut quartz crystal blanks are produced from thin quartz crystal wafer 1. As shown in FIG. 3A, quartz crystal block 2 is cut from a crystal body (not shown) of synthetic quartz crystal along X-, Y'-, and Z'-axes of quartz crystal. Specifically, quartz crystal block 2 has six surfaces including a pair of XZ' surfaces, a pair of XY' surfaces, and a pair of Y'Z' surfaces. If the XZ' surfaces of quart crystal block 2 are regarded as principal surfaces, then these principal surfaces are first polished to a mirror finish.

Figure 3B:
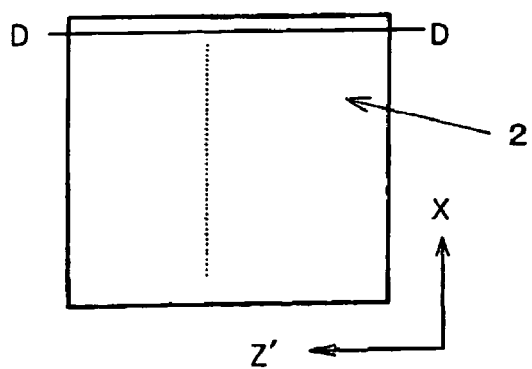
FIG. 3B is a plan view illustrative of the method of manufacturing a thin quartz crystal wafer according to the present invention.

Then, while quartz crystal block 2 is moving in the direction of the Z'-axis, one of the principal surfaces of quartz crystal block 2 is continuously irradiated with laser beam P applied in the direction of the Y'-axis. When one cycle of scanning quartz crystal block 2 with laser beam P in the direction of the Z'-axis is completed, quartz crystal block 2 is slightly moved in the direction of the X-axis. Then, while quartz crystal block 2 is moving in the direction of the —Z'-axis, quartz crystal block 2 is continuously irradiated with laser beam P. Line D—D in FIG. 3B represents the path of the beam spot of laser beam P on the irradiated principal surface of quartz crystal block 2 in one cycle of scanning quartz crystal block 2 with laser beam P in the direction of the Z'-axis. Laser beam P is focused or converged by a lens system (not shown) at a position within quartz crystal block 2 which is about 25 μm deep from the principal surface of quartz crystal block 2. Laser beam P is of a wavelength that is transmissive with respect to quartz crystal and is capable of breaking Si—O—Si (silicon-oxygen-silicon) interatomic bonds in quartz crystal by way of multiphoton absorption.

As a result, multiphoton absorption occurs due to the convergence of laser beam P in a region within quartz crystal block 2 which is about 25 μm deep from the principal surface of quartz crystal block 2, locally breaking Si—O—Si interatomic bonds of in quartz crystal. The broken interatomic bonds produce an optically damaged state, forming voids along the path of laser beam P in quartz crystal block 2. Since quartz crystal block 2 is moving along the Z'-axis and the X-axis, a number of voids are clustered in quartz crystal block 2 along a plane that is about 25 μm deep from the principal surface of quartz crystal block 2.

Thereafter, the principal surface of quartz crystal block 2 is applied to a fixture base such as a glass plate or the like by optical bonding or the like, and then heated to expand, activate, and explode the voids formed in quartz crystal block 2. The clustered voids are joined together along the plane, fully destroying interatomic bonds between a main body of quartz crystal block 2 and a surface layer (which will become thin quartz crystal wafer 1). As a result, the surface layer is peeled off the main body of quartz crystal block 2, producing thin quartz crystal wafer 1 having a thickness of about 25 μm.

After thin quartz crystal wafer 1 has been obtained, the principal surface of quartz crystal block 2 from which thin quartz crystal wafer 1 has been peeled is polished. Then, while quartz crystal block 2 is being scanned in the directions of the Z'-axis and the X-axis, laser beam P is converged at a position that is about 25 μm deep from the principal surface of quartz crystal block 2 to cause multiphoton phenomenon state. Voids are now formed in quartz crystal block 2 by multiphoton absorption, and then quartz crystal block 2 is heated to peel off next thin quartz crystal wafer 1. The above process is repeated to obtain a number of thin quartz crystal wafers 1 successively from quartz crystal block 2.

Figure 4:
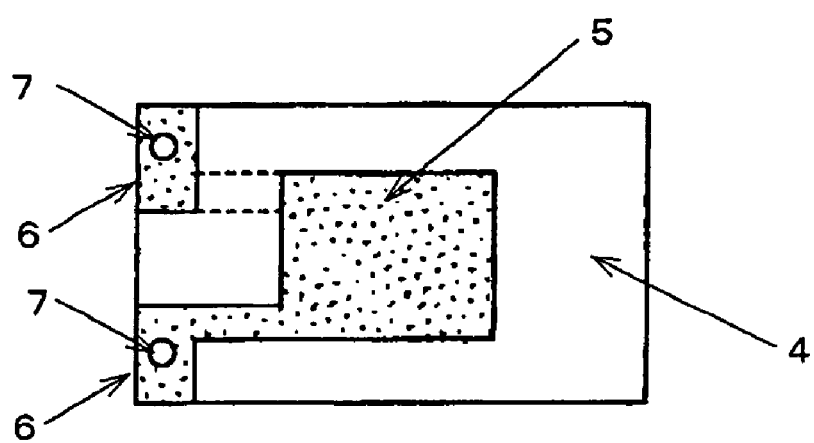
FIG. 4 is a plan view of a crystal blank.

Then, opposite principal surfaces of each of thin quartz crystal wafers 1 are polished until thin quartz crystal wafer 1 has a desired thickness. Thereafter, exciting electrodes 5 and extension electrodes 6 are integrally formed on both the principal surfaces of each of regions of thin quartz crystal wafers 1 which is to serve as a crystal blank. As shown in FIG. 4, on the end of the region which corresponds to each crystal blank and to which extension electrodes 6 extend, electrode layers serving as part of extension electrodes 6 are disposed on both principal surfaces. These electrode layers on both principal surfaces are electrically connected to each other via through-holes 7 defined in thin quartz crystal wafer 1. Thereafter, thin quartz crystal wafers 1 is divided into individual crystal blanks by a machining process using a wire saw or a blade saw. In this manner, a number of crystal blanks 4 as shown in FIG. 4 are obtained from each of thin quartz crystal wafers 1.

According to the manufacturing method described above, since thin quartz crystal wafer 1 is produced by using stealth dicing technology and applying a laser beam to the principal surface of quartz crystal block 2, thin quartz crystal wafer 1 can directly be obtained from quartz crystal block 2, rather than from a thick quartz crystal wafer which would otherwise need to be produced from quartz crystal block 2. Accordingly, the amount of quartz crystal that is wastefully ground off is highly reduced, and hence any quartz crystal wastes are minimized. For example, if a thin quartz crystal wafer having a thickness of 18 μm (corresponding to a resonant frequency of 100 MHz in case of an AT-cut crystal blank) is obtained from a conventional thick quartz crystal wafer having a thickness of 350 μm, then an amount of quartz crystal which corresponds to a thickness of 332 μm is wasted. According to the present embodiment, however, because a laser beam is converged at a depth of 25 μm from the principal surface of a quartz crystal block to peel a thin quartz crystal wafer from the quartz crystal block and the thin quartz crystal wafer is polished to a thickness of 18 μm, only an amount of quartz crystal which corresponds to a thickness of 7 μm is wasted. Consequently, the manufacturing method according to the present invention is 47 times more efficient than the conventional manufacturing process, and hence is highly productive.

According to the present embodiment, after one thin quartz crystal wafer 1 is peeled off quartz crystal block 2, the principal surface of quartz crystal block 2 is polished again, and the laser beam is applied to quart crystal block 2. Therefore, the laser beam can reliably be transmitted into quartz crystal block 2, and thin quartz crystal wafers 1 can successively be obtained from quartz crystal block 2. Each of thin quartz crystal wafers 1 is then divided into individual crystal blanks 4. Consequently, crystal units can be produced inexpensively. Extension electrodes 6 are formed on both principal surfaces of regions of thin quartz crystal wafer 1 which correspond to respective crystal blanks, and are electrically connected to each other via through holes 7. As a result, extension electrodes 6 can extend from one to the other of the principal surfaces of regions of thin quartz crystal wafer 1 before they are divided. According to the present embodiment, therefore, crystal units can be assembled immediately after thin quartz crystal wafer 1 is divided into crystal blanks.

The present invention is not limited to the preferred embodiment which has been described above, but various changes or modifications may be made therein.

For example, when laser beam P is applied to quartz crystal block 2 it may be intermittently applied not only in the direction of the X-axis, but also in the direction of the Z'-axis. In the above embodiment, after an optically damaged state is produced in quartz crystal block 2 by making the multiphoton phenomenon state, quartz crystal block 2 is heated to peel thin quartz crystal wafer 1 therefrom. However, rather than heating quartz crystal block 2, quartz crystal block 2 may be immersed or dipped in an etching solution to chemically peel thin quartz crystal wafer 1 therefrom.

Furthermore, after each thin quartz crystal wafer is divided into individual crystal blanks, excitation electrodes and extension electrodes may be formed on each of the crystal blanks.

What is claimed is:

1. A method of manufacturing a thin quartz crystal wafer from a quartz crystal block which is cut from a crystal body of synthetic quartz crystal and has a flat principal surface, the method comprising the steps of:
   (a) converging a laser beam through the principal surface at a region in said quartz crystal block at a predetermined depth from the principal surface thereof to cause multiphoton phenomenon state, thereby breaking Si—O—Si bonds of quartz crystal in said region to form voids in said region; and
   (b) peeling a portion of said quartz crystal block that includes the principal surface from a body of said quartz crystal block along said voids to form said thin quartz crystal wafer, wherein said thin crystal wafer has a smaller thickness, in a direction perpendicular to said principal surface, than said quartz crystal block.

2. The method according to claim 1, wherein said steps (a) and (b) are repeatedly carried out on said quartz crystal block from which said thin quartz crystal wafer has been peeled, for thereby peeling a plurality of thin quartz crystal wafers successively from the principal surface of said quartz crystal block.

3. The method according to claim 2, wherein the principal surface of said quartz crystal block is polished after said thin quartz crystal wafer has been peeled therefrom, and then said step (a) is carried out on said quartz crystal block.

4. The method according to claim 1, wherein said step (b) comprises the step of heating said quartz crystal block.

5. The method according to claim 1, wherein said step (b) comprises the step of immersing said quartz crystal block in an etching solution.

6. The method according to claim 1, further comprising the steps of:
   polishing said thin quartz crystal wafer; and
   dividing said polished thin quartz crystal wafer into individual crystal blanks.

7. The method according to claim 6, wherein each of said crystal blanks is an AT-cut crystal blank.

8. The method according to claim 1, further comprising the steps of:
   polishing said thin quartz crystal wafer;
   forming excitation electrodes and extension electrodes in regions, corresponding respectively to individual crystal blanks, on both principal surfaces of said polished thin quartz crystal wafer; and
   dividing said thin quartz crystal wafer with said excitation electrodes and extension electrodes formed thereon into said individual crystal blanks.

9. The method according to claim 8, wherein each of said crystal blanks is an AT-cut crystal blank.

* * * * *